(12) United States Patent
Veinot et al.

(10) Patent No.: US 9,452,446 B2
(45) Date of Patent: Sep. 27, 2016

(54) METHOD FOR DEPOSITING SILICON NANOCRYSTALS IN HOLLOW FIBERS

(75) Inventors: Jonathan Veinot, St. Albert (CA); Jose Roberto Rodriguez, Edmonton (CA); Pablo Bianucci, Edmonton (CA); Al Meldrum, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 1482 days.

(21) Appl. No.: 12/934,125

(22) PCT Filed: Mar. 31, 2009

(86) PCT No.: PCT/CA2009/000393
§ 371 (c)(1),
(2), (4) Date: Dec. 8, 2010

(87) PCT Pub. No.: WO2009/121171
PCT Pub. Date: Oct. 8, 2009

(65) Prior Publication Data
US 2011/0104412 A1 May 5, 2011

Related U.S. Application Data

(60) Provisional application No. 61/041,287, filed on Apr. 1, 2008.

(51) Int. Cl.
| | | |
|---|---|---|
| *C30B 7/14* | (2006.01) | |
| *C30B 29/06* | (2006.01) | |
| *C30B 29/66* | (2006.01) | |
| *C30B 30/00* | (2006.01) | |
| *C30B 7/06* | (2006.01) | |
| *B05D 7/22* | (2006.01) | |
| *B82Y 15/00* | (2011.01) | |
| *B82Y 20/00* | (2011.01) | |
| *B82Y 30/00* | (2011.01) | |
| *C01B 33/021* | (2006.01) | |
| *C01B 33/023* | (2006.01) | |
| *C30B 28/04* | (2006.01) | |
| *C30B 29/60* | (2006.01) | |

(52) U.S. Cl.
CPC ................ *B05D 7/222* (2013.01); *B05D 7/22* (2013.01); *B82Y 15/00* (2013.01); *B82Y 20/00* (2013.01); *B82Y 30/00* (2013.01); *C01B 33/021* (2013.01); *C01B 33/023* (2013.01); *C30B 7/06* (2013.01); *C30B 28/04* (2013.01); *C30B 29/06* (2013.01); *C30B 29/605* (2013.01); *Y10T 428/13* (2015.01); *Y10T 428/1317* (2015.01)

(58) Field of Classification Search
CPC ............. C30B 7/00; C30B 7/02; C30B 7/06; C30B 28/04; C30B 29/605; C30B 29/06; C30B 29/60; C01B 33/021; C01B 33/023; B05D 7/22; B05D 7/222; C03B 25/00; C03B 27/0004; C03B 27/012; C03B 2203/14; C03B 2203/16
USPC .................................. 428/398; 427/230, 232
See application file for complete search history.

(56) References Cited

U.S. PATENT DOCUMENTS

| | | | | |
|---|---|---|---|---|
| 4,689,267 A | * | 8/1987 | Takamizawa et al. | 96/10 |
| 5,567,471 A | * | 10/1996 | Harrington et al. | 427/163.2 |
| 5,815,627 A | * | 9/1998 | Harrington | 385/125 |
| 5,881,200 A | * | 3/1999 | Burt | 385/142 |
| 6,150,019 A | * | 11/2000 | Smith et al. | 428/376 |
| 6,667,099 B1 | * | 12/2003 | Greiner et al. | 428/398 |
| 6,924,346 B2 | | 8/2005 | Biovert et al. | |
| 7,054,513 B2 | * | 5/2006 | Herz et al. | 385/12 |
| 7,105,228 B2 | * | 9/2006 | Averdung et al. | 428/398 |
| 7,142,758 B1 | * | 11/2006 | Herz et al. | 385/125 |
| 2011/0104412 A1 | * | 5/2011 | Veinot et al. | 428/34.6 |

FOREIGN PATENT DOCUMENTS

WO WO2006/125313 A1 11/2006

OTHER PUBLICATIONS

D. Amans, S. Callard, A. Gagnaire, J. Joseph, G. Ledoux, and F. Huisken, J. Appl. Phys. 93, 4173 (2003).
D. Amans, S. Callard, A. Gagnaire, J. Joseph, G. Ledoux, and F. Huisken, Mat. Sci. Eng. B-Solid 101, 305 (2003).
A. M. Beltaos and A. Meldrum, J. Lumin. 126, 607 (2007).
Bianucci et al., Mode Structure in the luminescence of Si-nc in cylindrical microcavities. 41(6):1107-1110, 2009.
J. S. Biteen, N. S. Lewis, H. A. Atwater, and A. Polman, Appl. Phys. Lett. 84, 5389 (2004).
L. T. Canham, Appl. Phys. Lett. 57, 1046 (1990).
T. J. Clement, R. G. DeCorby, N. Ponnampalam, T. W. Allen, A. Hryciw, and A. Meldrum, Opt. Express 14, 12151 (2006).
J. Heitmann, F. Muller, M. Zacharias, and U. Gosele, Adv. Mater. 17, 795 (2005).
C. M. Hessel, E. J. Henderson, and J. G. C. Veinot, Chem. Mater. 18, 6139 (2006).
C. M. Hessel, E. J. Henderson, and J. G. C. Veinot, J. Phys. Chem. C 111, 6956 (2007).
C. M. Hessel, M. A. Summers, A. Meldrum, M. Malac, J. G. C. Veinot, Adv. Mater, 19, 3513 (2007).
R. Lockwood, A. Hryciw, and A. Meldrum, Appl. Phys. Lett. 89, 263112 (2006).
T. Ostatnicky, J. Valenta, I. Pelant, K. Luterova, R. G. Elliman, S. Cheylan, and B. Honerlage, Opt. Mater. 27, 781 (2005).

(Continued)

*Primary Examiner* — William Phillip Fletcher, III
(74) *Attorney, Agent, or Firm* — Bereskin & Parr LLP/S.E.N.C.R.L., s.r.l.; Michael Fenwick

(57) ABSTRACT

A method for depositing a layer of silicon nanocrystals upon the inside surface of hollow fibers is disclosed. In particular, the method includes inserting a hollow glass fiber into a solution of hydrogen silsesquioxane, removing the solvent and heating the hollow glass fiber to a temperature suitable to form silicon nanocrystals, and subsequently cooling the hollow glass fiber.

19 Claims, 3 Drawing Sheets

(56) References Cited

OTHER PUBLICATIONS

J. Y. Sung, A. Tewary, M. L. Brongersma, and J. H. Shin, IEEE J. Sel. Top. Quant. 12, 1388 (2006).

A. Tewary, M. J. F. Digonnet, J. Y. Sung, J. H. Shin, and M. L. Brongersma, IEEE J. Sel. Top. Quant. 12, 1476 (2006).

K. J. Vahala, Nature 424, 839 (2003).

J. Valenta, N. Lalic, and J. Linnros, Opt. Mater. 17, 45 (2001).

R. J. Zhang, S. Y. Seo, A. P. Milenin, M. Zacharias, and U. Gosele, Appl. Phys. Lett. 88, 153120 (2006).

F. Iacona, G. Franzo, E. C. Moreira, and F. Priolo, J. Appl. Phys. 89, 8354 (2001).

A. Hryciw, J. Laforge, C. Blois, M. Glover, and A. Meldrum, Adv. Mater. 17, 845 (2005).

A. G. Cullis, L. T. Canham, and P. D. J. Calcott, J. Appl. Phys. 82, 909 (1997).

J. G. C. Veinot, Chem. Comm., 4160 (2006).

A. Meldrum, A. Hryciw, K. S. Buchanan, A. M. Beltaos, M. Glover, C. A. Ryan, and J. G. C. Veinot, Opt. Mater. 27, 812 (2005).

\* cited by examiner

METHOD FOR DEPOSITING SILICON NANOCRYSTALS IN HOLLOW FIBERS

This application is a national phase entry of PCT/CA2009/000393, filed Mar. 31, 2009, which claims priority from U.S. Provisional patent application Ser. No. 61/041,287 filed Apr. 1, 2008.

FIELD

The present disclosure relates to a method for depositing a layer of silicon nanocrystals on the inner surface of a hollow fiber.

BACKGROUND

The optical properties of silicon nanocrystals in porous silicon, silica-embedded silicon nanocrystals, and freestanding silicon nanocrystals have been widely investigated.[1] The luminescence appears to be related to the combined factors of cluster size,[2] interface effects,[3] and cluster-to-cluster energy transfer mechanisms,[4] and may lead to practical devices such as light emitting diodes,[5] waveguide amplifiers,[6] or optical sensors.[7] In addition, a major push for a silicon nanocrystal laser exists.[8] The emission from silicon nanoparticles will likely need to be confined within a high-quality optical cavity in order to decrease the lasing threshold.[9] A variety of cavity structures containing silicon nanocrystals have been reported, including planar cavities,[10] microdisks,[11] and coated microspheres.[7,12,13] These studies reported cavity Q-factors ranging from several hundred for planar cavities, up to 1200-1500 for coated microspheres. Q-factors of about $10^5$ were recently found for $SiO_x$-coated silica spheres, although the coupling of the nanocrystal fluorescence into these modes was not demonstrated.[13] Whispering gallery mode resonators possess both high Q-factors and low mode volumes, making them potential candidates for the development of a silicon nanocrystal laser.

SUMMARY

In accordance with the present disclosure, a method for depositing a layer of silicon nanocrystals on a hollow fiber is described. In particular, the invention includes a method for depositing a layer of oxide embedded silicon nanocrystals upon the inner surface of a hollow glass fiber wherein the tip of a hollow glass fiber is inserted into a solution of hydrogen silsesquioxane (HSQ), the solvent removed, the fiber is then heated to a temperature suitable to form silicon nanocrystals, and then the fiber is subsequently cooled.

Accordingly, the disclosure includes a method for depositing silicon nanocrystals on an inner surface of a hollow fiber comprising:
a) inserting a tip of the hollow fiber into a solution of hydrogen silsesquioxane (HSQ) in a suitable solvent at an angle of about 70° to about 90° between the fiber and the solution, wherein an inner surface of the fiber is coated with the HSQ solution by capillary action;
b) heating the coated hollow fiber in a reducing atmosphere under conditions to remove the solvent;
c) heating the hollow fiber in a reducing atmosphere to a temperature suitable to form silicon nanocrystals; and
d) cooling the hollow fiber.

In an embodiment of the disclosure, the hollow fiber has an inner diameter of about 1 µm to about 250 µm. In another embodiment of the disclosure, the hollow fiber has an inner diameter of about 25 µm to about 100 µm. In a further embodiment, the hollow fiber has an inner diameter of about 25 µm to about 50 µm.

In an embodiment of the disclosure, the hollow fiber is a hollow glass capillary tube.

In another embodiment of the disclosure, the solvent is methyl isobutyl ketone. In a further embodiment, the HSQ solution is obtained from Dow Corning Corporation.

In an embodiment of the disclosure, the angle between the hollow fiber and the solution is about 80° to about 90°. In a further embodiment, the angle between the hollow fiber and the solution is about 85° to about 90°.

In another embodiment of the disclosure, the reducing atmosphere comprises hydrogen gas. In a further embodiment, the hydrogen gas is present at a concentration of about 1% to about 10% (w/w).

In an embodiment of the disclosure, the conditions to remove the solvent in b) comprise heating to a suitable temperature of about 200° C. to about 400° C., suitably about 250° C. to about 350° C., more suitably about 300° C. In another embodiment, the temperature in b) is increased to the suitable temperature at a rate of about 5° C./min. In a subsequent embodiment of the disclosure, the hollow fiber is heated at the suitable temperature in b) for a period of about 1 hour to about 3 hours. In a further embodiment, the hollow fiber is heated at the suitable temperature in b) for a period of about two hours.

In an embodiment of the disclosure, the suitable temperature in c) is about 900° C. to about 1300° C., suitably about 1000° C. to about 1200° C., and more suitably about 1100° C. In another embodiment, temperature is increased from the temperature in b) to the temperature in c) at a rate of about 18° C./min. In a subsequent embodiment, the hollow fiber is heated at the suitable temperature in c) for a period of about 0.5 hours to about 2 hours. In another embodiment, the hollow fiber is heated at the suitable temperature in c) for a period of time sufficient to form silicon nanocrystals, for example, about 1 hour.

In another embodiment of the disclosure, the hollow fiber is cooled in d) to room temperature. In a further embodiment, the hollow fiber is cooled to room temperature in d) at a rate of about 2° C./min.

Other features and advantages of the present disclosure will become apparent from the following detailed description. It should be understood, however, that the detailed description and the specific examples while indicating preferred embodiments of the disclosure are given by way of illustration only, since various changes and modifications within the spirit and scope of the disclosure will become apparent to those skilled in the art from this detailed description.

BRIEF DESCRIPTION OF THE DRAWINGS

The disclosure will now be described in greater detail with reference to the following drawings in which.

DETAILED DESCRIPTION

A straightforward solution-based method for depositing silicon nanocrystals on the inner surface of a hollow fiber is described. With this method, a hollow glass fiber is inserted, at an appropriate angle, into a solution of HSQ, the solvent is removed, and the fiber is then heated to a temperature suitable to form silicon nanocrystals and subsequently cooled.

Accordingly, the present disclosure includes a method for depositing silicon nanocrystals on an inner surface of a hollow fiber comprising:
a) inserting a tip of the hollow fiber into a solution of hydrogen silsesquioxane (HSQ) in a suitable solvent at an angle of about 70° to about 90° between the fiber and the solution, wherein an inner surface of the fiber is coated with the HSQ solution by capillary action;
b) heating the coated hollow fiber in a reducing atmosphere under conditions to remove the solvent;
c) heating the hollow fiber in a reducing atmosphere to a temperature suitable to form silicon nanocrystals; and
d) cooling the hollow fiber.

The term "fiber" means an elongated thread made of any solid optical material that is transparent to luminescence and is hollow, and accordingly has an inner surface. In an embodiment, the fiber is a hollow glass fiber, such as a glass capillary tube. In a further embodiment, the glass fiber is a fused silica hollow glass fiber. In another embodiment, the fiber is cleaned and dried prior to insertion into the HSQ solution. In an embodiment the fiber is cleaned using an acid wash and/or a piranha (3:1 solution of $H_2SO_4$ and $H_2O_2$) wash, followed by drying, for example with the application of heat, such as by flame drying.

In an embodiment of the present disclosure, the hollow fiber has an inner diameter of about 1 μm about 250 μm. In a further embodiment, the hollow fiber has an inner diameter of about 25 μm to about 100 μm. In a subsequent embodiment, the hollow fiber has an inner diameter of about 25 μm to about 50 μm. It will be understood by those skilled in the art that the hollow fibers possess an inner surface upon which the silicon nanocrystals are deposited. It is a further embodiment of the present disclosure that only a portion of the inner surface is coated with the silicon nanocrystals. In another embodiment, substantially all, or all, of the inner surface is coated with the silicon nanocrystals. It will be understood by those skilled in the art that the term "coated" as used herein means that at least a portion, or all, of the inner surface of the fiber is in contact with the HSQ solution. Accordingly, the term "coated" includes a layer, of varying thickness, of the HSQ solution on the inner surface, as well as the fiber being completely filled with the HSQ solution as a result of capillary action.

In an embodiment of the present disclosure, the suitable solvent is any solvent which is able to dissolve the HSQ, and subsequently, is able to be removed from the HSQ. In another embodiment, the solvent is methyl isobutyl ketone.

Figure 1:
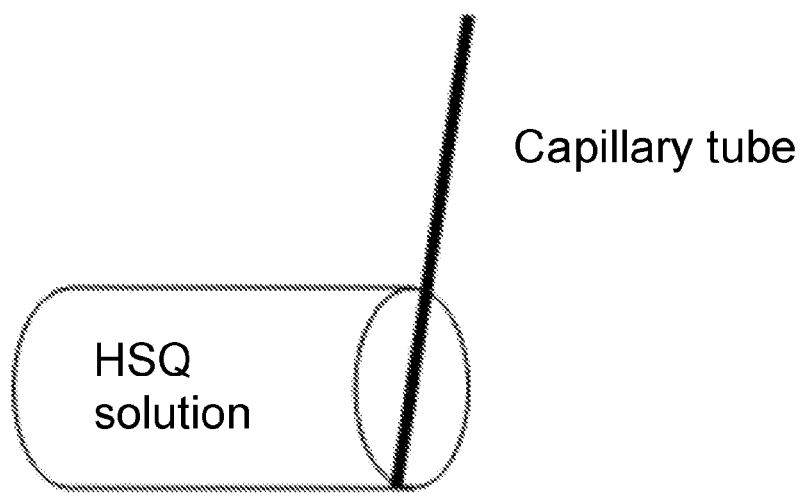
FIG. 1 shows a schematic of the insertion of a glass capillary into a HSQ solution according to one embodiment of the present disclosure.

In another embodiment of the present disclosure, the tip of a hollow fiber is inserted in a solution of HSQ at an angle as close to 90° as possible as shown in FIG. 1. In an embodiment, the angle between the hollow fiber and the solution is about 70° to about 90°. In a further embodiment, the angle between the hollow fiber and the solution about 80° to about 90°. In another embodiment, the angle between the hollow fiber and solution is about 85° to about 90°. It will be understood by those skilled in the art that when the hollow fiber is inserted in a solution of HSQ, the solution is drawn up inside the hollow glass fiber by capillary action. The amount of solution that is drawn up inside the hollow fiber will be dependent upon the diameter of the hollow fiber as well as the concentration of the HSQ, the type of solvent used and the time and angle of insertion and these variables may be adjusted by a person skilled in the art to obtain the desired amount of silicon nanocrystals. In another embodiment, the fibre is contacted with the solution one or more times.

In an embodiment of the present disclosure, the conditions to remove the solvent in b) comprise heating the hollow fiber in a furnace under a reducing atmosphere at a temperature and for a time sufficient to remove substantially all of the solvent. In another embodiment of the present disclosure, the conditions to remove the solvent in b) comprise heating the hollow fiber in a furnace under a reducing atmosphere to a suitable temperature of about 200° C. to about 400° C. In a subsequent embodiment, the conditions in b) comprise heating in a furnace under a reducing atmosphere to a suitable temperature of about 250° C. to about 350° C. In another embodiment, the conditions in b) comprise heating in a furnace under a reducing atmosphere to a suitable temperature of about 300° C. In an embodiment, the temperature in b) is increased at a rate of about 5° C. per minute. In a further embodiment, the hollow fiber is heated in b) in a furnace to a suitable temperature of about 200° C. to about 400° C. for about 1 hour to 3 hours under a reducing atmosphere. In a subsequent embodiment, the hollow fiber is heated in b) for about 2 hours.

In an embodiment of the present disclosure, the reducing atmosphere comprises hydrogen gas ($H_2$). In an embodiment, the hydrogen gas is at a concentration of about 1% to about 10% (w/w) in an inert gas, such as argon.

In another embodiment, the hydrogen gas is at a concentration of about 5%. In an embodiment of the present disclosure, after the hollow glass fiber is heated in a reducing atmosphere in b) to remove the solvent, the hollow glass fiber is heated to a temperature suitable to convert the HSQ into silicon nanocrystals. Accordingly, in an embodiment, the temperature in the furnace is increased in c) to a suitable temperature of about 900° C. to about 1300° C. while maintaining a reducing atmosphere. In another embodiment, the temperature in c) is increased to a suitable temperature of about 1000° C. to about 1200° C. In a further embodiment, the temperature in c) is increased to a suitable temperature of about 1100° C. In an embodiment of the disclosure, the temperature in b) is increased to the temperature in c) at a rate of about 18° C. per minute. In another embodiment, the hollow fiber is heated at the suitable temperature in c) for a period of about 0.5 hours to 2 hours. In another embodiment, the hollow glass fiber is heated at the suitable temperature in c) for about one hour. The temperature and timing in c) are optimized for the formation of silicon nanocrystals and may be adjusted by a person skilled in the art depending, for example, on the size and material of the hollow fiber.

In another embodiment of the present disclosure, after heating at the suitable temperature in c), the hollow fiber is cooled to room temperature. In a further embodiment, the hollow fiber is cooled to room temperature at rate of about 2° C. per minute.

Hollow fibers treated in accordance with the method of the present disclosure result in a hollow fiber having silicon nanocrystals deposited on the inner surface. The silicon nanocrystals are typically in a layer on the inner surface of the hollow fiber. The term "layer" means a coating of smooth uniform thickness. The thickness of the silicon nanocrystal layer deposited on the inner surface of the hollow fibers is dependent upon the inner diameter of the hollow fiber. For example, when a hollow glass fiber with an inner diameter of 25 µm is treated in accordance with the method of the present disclosure, the thickness of the silicon nanocrystal layer is about 0.6 µm. In addition, when a hollow glass fiber with an inner diameter of 50 µm is treated in accordance with the method of the present disclosure, the thickness of the silicon nanocrystal layer is about 1.5 µm. In another embodiment of the present disclosure, the method of the present disclosure deposits smooth, uniform layers of silicon nanocrystals for a length of about 2 cm to 3 cm along the hollow fiber. The silicon nanocrystal photoluminescence is coupled to the whispering gallery modes yielding Q-factors for the hollow fibers, for example, of at least 2500 for a 50 µm capillary. The silicon nanocrystals deposited onto hollow glass fibers using the method of the present disclosure are oxide embedded silicon nanocrystals.

The present disclosure further includes devices comprising a hollow fiber coated with a layer of silicon nanocrystals prepared using a method of the present disclosure. In an embodiment of the disclosure, the device is a light emitting diode, waveguide amplifier, optical sensor or laser.

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Finally, terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The following non-limiting examples are illustrative of the present disclosure:

EXAMPLES

Reagents and Materials

HSQ was purchased from Dow Corning (tradename FOx-"1X"®, X=1-7) as solution in methyl isobutyl ketone. This stock solution was used as received and stored in subdued light and inert atmosphere prior to use

Example 1

Depositing a Layer of Silicon Nanocrystals (Si-nc) on the Inside Surface of a Hollow Glass Fiber The hollow glass fibers used in the present disclosure were polyimide coated fused silica capillary tubes (Polymicro Technologies) with inner diameters of 100, 50, and 25 µm. The polymer coating was removed by placing the capillaries in boiling sulfuric acid (EMD Chemicals) followed by sequential rinsing with distilled water and "piranha" solution (i.e., 3:1 $H_2SO_4$:$H_2O_2$ (Fischer Scientific)). The capillary tubes were subsequently rinsed with distilled water, flame dried, and loaded with a commercially available solution of HSQ dissolved in methyl isobutyl ketone[15] using capillary forces. In order to load the capillary tubes, a vial was filled with the HSQ solution, placed horizontally and the tip of the capillary tube is inserted in the solution. The angle between the capillary and the liquid was as close to 90° as possible (FIG. 1). The samples were then heated in a tube furnace (Lindberg Blue) under a reducing atmosphere (95% Ar, 5% $H_2$ (Praxair)) from room temperature to 300° C. at 5° C./min where they remained for 2 hours to remove any solvent. The temperature was subsequently increased to 1100° C. at a rate of 18° C./min and maintained there for 1 hour. The capillaries were then cooled to room temperature at a rate of 2° C./min.

After thermal processing, the interior of the fibers possessed the characteristic orange/brown appearance of oxide embedded Si-nc composite films. Detailed characterization of analogously prepared powders and thin films on flat substrates has been presented elsewhere.[14,16] The thickness of the Si-nc layer was found to depend on the capillary tube inner diameter: the layers were ~0.6 µm and 1.5 µm thick for the 25 µm and 50 µm capillary tubes, respectively, as estimated by cross-sectional optical microscopy (the thinnest films are near the diffraction limit) and confirmed by SEM for the 25 µm samples. The deposited layer of silicon nanocrystals formed in the 25 µm and 50 µm hollow glass fibers were smooth, uniform, and crack free over lengths of 2-3 cm; however, the layers on the 100 µm capillary tubes had numerous cracks attributable to the delamination of the thick films, consistent with a recent report on the properties of annealed HSQ.[17]

Discussion

Figure 2:
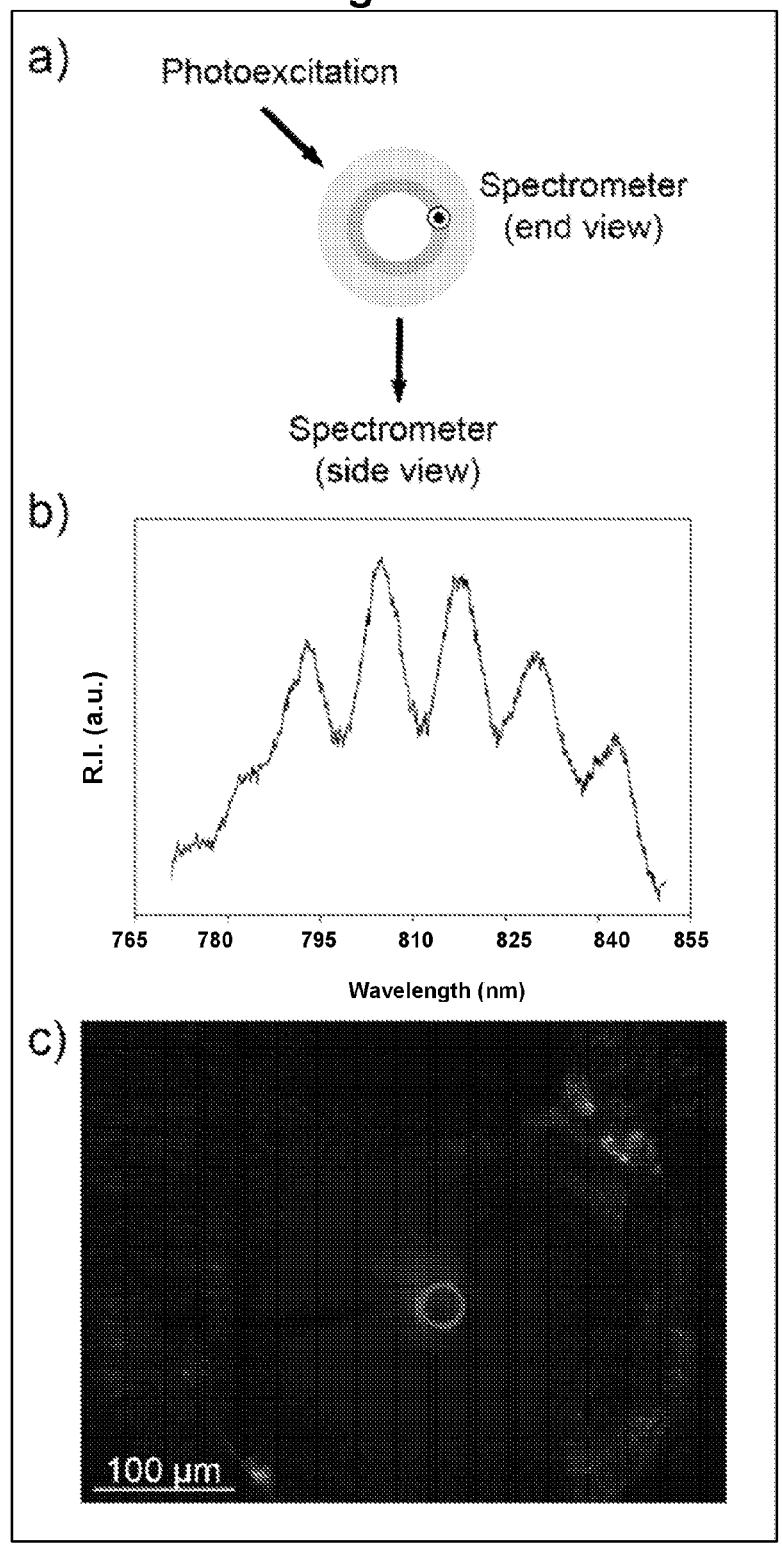
FIG. 2a is a schematic diagram of a photoluminescence experimental setup accordingly to one embodiment of the present disclosure.
FIG. 2b shows a representative photoluminescence spectrum taken from an "end on" position of a 25 µm capillary.
FIG. 2c is a fluorescence image of the tip of a 25 µm capillary—blue laser light defines the outer diameter of the capillary.

Photoluminescence spectra of the oxide embedded Si-nc layers were obtained by pumping the treated capillary tubes with the 488 nm line of an Ar laser interfaced to a fluorescence microscope. The layer of Si-nc appears in cross-section as a well-defined red fluorescent ring on the inner surface of the capillary tube (FIG. 2a). The red photoluminescence penetrated slightly into the inner diameter of the lower-index capillary tube. This is consistent with the presence of guided and leaky modes[18] extending along the layer and inner region of the capillary tube, parallel to its axis. The photoluminescence peaked at about 810 nm, typical for ensembles of Si-nc (as seen in FIG. 2b). A weak mode structure was observed in the photoluminescence spectrum taken from this "end on" direction (FIG. 2b), which may arise from the interface of guided or leaky modes for light propagating along the inner length of the capillary tube. The Q-factors for these modes are uniformly low (<100), and are therefore of relatively little interest for the formation of a high-Q cavity structure.

Figure 3:
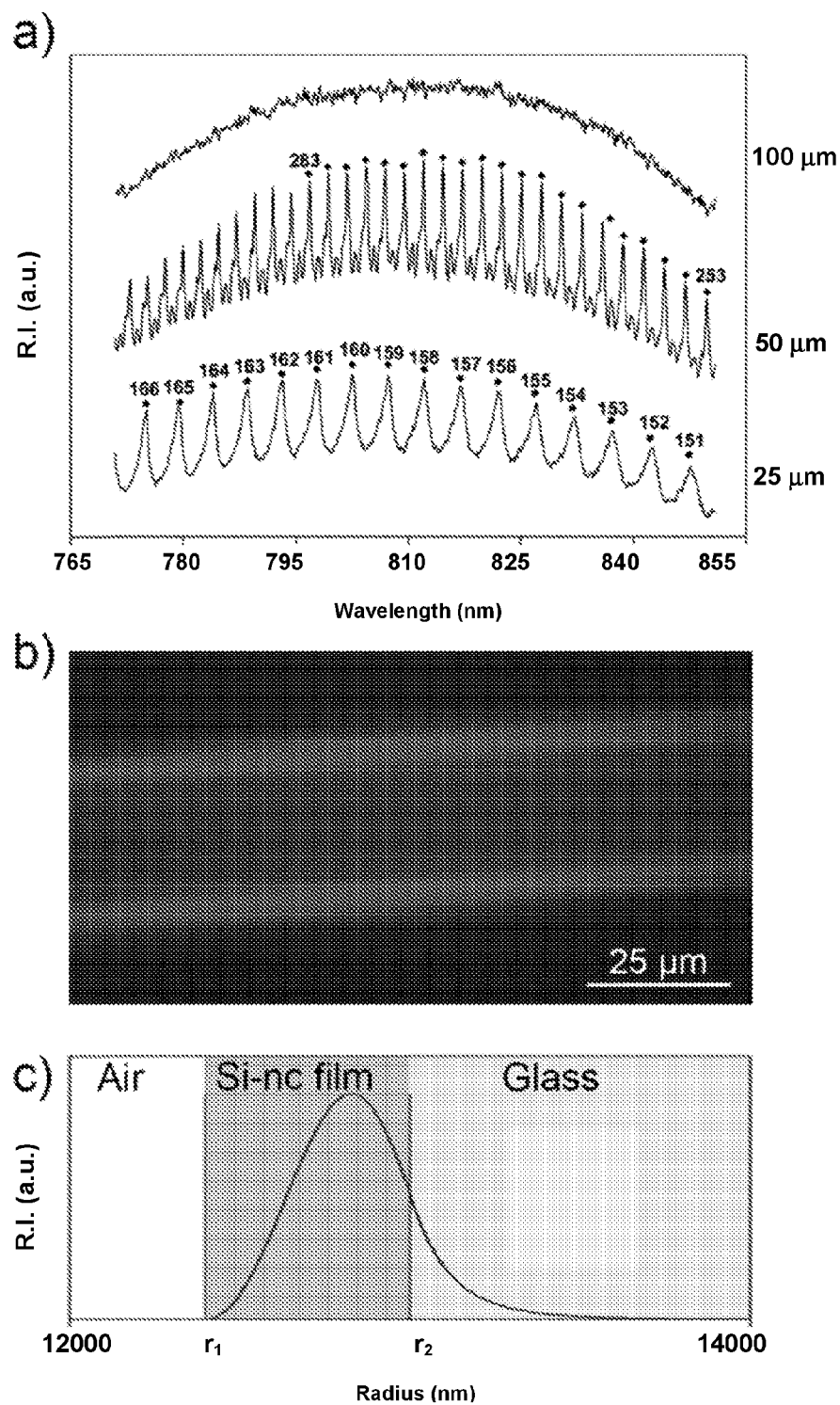
FIG. 3a shows photoluminescence spectra of 100 μm, 50 μm and 25 μM capillaries taken perpendicular to the axis. The theoretical results from equations (1) and (2) for first order modes are shown over the peaks. The data is offset for clarity.
FIG. 3b shows a photoluminescence image of a 25 μm capillary.
FIG. 3c shows a theoretical intensity profile for the luminescence from a cylindrical WGM in a 25 μm capillary.

In contrast, imaging and spectroscopy of the Si-nc fluorescence collected perpendicular to the long axis of the capillary tube demonstrated an extremely sharp, well formed mode structure that is obviously suggestive of whispering gallery modes (WGMs) as seen in FIG. 3a. The refractive index contrast between the higher-index nanocrystal layer and its surrounding media (air on one side and the fused silica capillary on the other) confines the silicon nanocrystal fluorescence to circulate within the inner capillary radius, as observed in the photoluminescence image in FIG. 3b. A theoretical analysis was performed to model the mode spectra, using the inner diameter of the capillary tube, Si-nc layer thickness, and refractive index as variable parameters. Each WGM is characterized by its polarization (TE or TM), an azimuthal mode number l, and a radial mode number p. The radial distribution of the field in a mode is given by, $$F_z(r)^{(l,p)} = \begin{cases} AJ_l(k_0^{(p)}n_{air}r), & r \leq r_1; \\ BJ_l(k_0^{(p)}n_{film}r) + CH_l^{(1)}(k_0^{(p)}n_{film}r), & r_1 \leq r \leq r_2; \\ DH_l^{(1)}(k_0^{(p)}n_{glass}r), & r \geq r_2 \end{cases}$$

where $J_l$ and $H_l^{(l)}$ are Bessel functions of the first kind and third kind, respectively, and $F_z$ is the electric (magnetic) field for TM (TE) modes.

Enforcing boundary conditions at the interfaces results in a characteristic equation that can be numerically solved to find the mode resonant wavelength:

$$\begin{vmatrix} J_l(k_0^{(p)}n_{air}r_1) & -J_l(k_0^{(p)}n_{film}r_1) & -H_l^{(1)}(k_0^{(p)}n_{film}r_1) & 0 \\ J_l'(k_0^{(p)}n_{air}r_1) & -J_l'(k_0^{(p)}n_{film}r_1) & -H_l^{(1)\prime}(k_0^{(p)}n_{film}r_1) & 0 \\ 0 & J_l(k_0^{(p)}n_{film}r_2) & H_l^{(1)}(k_0^{(p)}n_{film}r_2) & -H_l^{(1)}(k_0^{(p)}n_{glass}r_2) \\ 0 & J_l'(k_0^{(p)}n_{film}r_2) & H_l^{(1)\prime}(k_0^{(p)}n_{film}r_2) & -H_l^{(1)\prime}(k_0^{(p)}n_{glass}r_2) \end{vmatrix} = 0$$

The known inner diameter of the capillary tube and the Si-nc layer thickness of the 25 μm capillary tubes was used in Equation 2 to obtain a theoretical mode spectrum (FIG. 3c). The refractive index of the film was adjusted to fit a value $n_{film}=1.67$ (consistent with literature for Si-nc films[19]) to achieve the best agreement with the observed spectrum. Applying the same process to the 50 μm capillary tube permitted partial indexing of the modes; however, full indexing in this case was not possible because of limitations associated with the numerical evaluation of the higher-order Bessel functions.

The Q-factors for the WGMs orbiting along the inner capillary diameter can be compared for the different samples. The modes became better defined and narrower with increasing diameter. The spectrum for the 50 μm capillary tube shows both the well-defined first order modes as well as higher order radial modes of lower photoluminescence intensity, consistent with the thicker layer in this sample (this effect cannot be TE and TM splitting, since the polarizations are degenerate in the case of a cylinder). Capillary tubes with an inner diameter of 100 μm show no indication of WGMs under the current conditions. To calculate Q-factors ($Q=\lambda/\Delta\lambda$), the PL background was subtracted from the 50 μm and 25 μm spectra using a baseline removal procedure, and the linewidths were measured in the resulting spectrum. The 1.3 nm full width half maximum (FWHM) of the 25 μm capillary tube results in Q~630, while the 0.3 nm FWHM (possibly instrument limited by the manufacturer-quoted ultimate spectrometer resolution of 0.2 nm) of the modes in the 50 μm capillary tube gives Q-factor of ~2500. These values are high compared to other Q-factors reported in the fluorescence of Si-nc, which range from 100 in planar cavities to 1500 for coated microspheres.[11,12]

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

FULL CITATIONS FOR DOCUMENTS REFERRED TO IN THE SPECIFICATION

[1] L. T. Canham, Appl. Phys. Lett. 57, 1046 (1990); A. G. Cullis, L. T. Canham, and P. D. J. Calcott, J. Appl. Phys. 82, 909 (1997); J. G. C. Veinot, Chem. Comm., 4160 (2006); A. Meldrum, A. Hryciw, K. S. Buchanan, A. M. Beltaos, M. Glover, C. A. Ryan, and J. G. C. Veinot, Opt. Mater. 27, 812 (2005).
[2] J. Heitmann, F. Muller, M. Zacharias, and U. Gosele, Adv. Mater. 17, 795 (2005).
[3] J. S. Biteen, N. S. Lewis, H. A. Atwater, and A. Polman, Appl. Phys. Lett. 84, 5389 (2004).
[4] R. Lockwood, A. Hryciw, and A. Meldrum, Appl. Phys. Lett. 89, 263112 (2006).
[5] J. Valenta, N. Lalic, and J. Linnros, Opt. Mater. 17, 45 (2001).
[6] T. J. Clement, R. G. DeCorby, N. Ponnampalam, T. W. Allen, A. Hryciw, and A. Meldrum, Opt. Express 14, 12151 (2006).
[7] A. Tewary, M. J. F. Digonnet, J. Y. Sung, J. H. Shin, and M. L. Brongersma, IEEE J. Sel. Top. Quant. 12, 1476 (2006).
[8] See Towards the First Silicon Laser, L. Pavesi, S. Gaponenko, and L. Dal Negro (Eds.), NATO Science Series Vol. 93, Kluwer Academic Publishers, Dordrecht, 2003.
[9] K. J. Vahala, Nature 424, 839 (2003).
[10] D. Amans, S. Callard, A. Gagnaire, J. Joseph, G. Ledoux, and F. Huisken, Mat. Sci. Eng. B-Solid 101, 305 (2003); F. Iacona, G. Franzo, E. C. Moreira, and F. Priolo, J. Appl. Phys. 89, 8354 (2001); A. Hryciw, J. Laforge, C. Blois, M. Glover, and A. Meldrum, Adv. Mater. 17, 845 (2005).
[11] R. J. Zhang, S. Y. Seo, A. P. Milenin, M. Zacharias, and U. Gosele, Appl. Phys. Lett. 88, 153120 (2006).
[12] A. M. Beltaos and A. Meldrum, J. Lumin. 126, 607 (2007).
[13] J. Y. Sung, A. Tewary, M. L. Brongersma, and J. H. Shin, IEEE J. Sel. Top. Quant. 12, 1388 (2006).
[14] C. M. Hessel, E. J. Henderson, and J. G. C. Veinot, Chem. Mater. 18, 6139 (2006).
[15] Dow Corning, tradename FOx-15
[16] C. M. Hessel, E. J. Henderson, and J. G. C. Veinot, J. Phys. Chem. C 111, 6956 (2007).
[17] C. M. Hessel, M. A. Summers, A. Meldrum, M. Malac, J. G. C. Veinot, Adv. Mater, 19, 3513 (2007)
[18] T. Ostatnicky, J. Valenta, I. Pelant, K. Luterova, R. G. Elliman, S. Cheylan, and B. Honerlage, Opt. Mater. 27, 781 (2005).
[19] D. Amans, S. Callard, A. Gagnaire, J. Joseph, G. Ledoux, and F. Huisken, J. Appl. Phys. 93, 4173 (2003).

The invention claimed is:

1. A method for depositing a layer of silicon nanocrystals on an inner surface of a hollow fiber and obtaining whispering gallery mode resonator, the method comprising:
 a) inserting a tip of the hollow fiber into a solution of hydrogen silsquloxane (HSQ) in a suitable solvent at an angle of about 70° to about 90° between the fiber and the solution, wherein an inner surface of the fiber is coated with the HSQ solution by capillary action;

b) heating the coated hollow fiber in a reducing atmosphere under conditions to remove the solvent;

c) heating the hollow fiber in a reducing atmosphere to a temperature suitable to form silicon nanocrystals; and d) cooling the hollow fiber to obtain the whispering gallery mode resonator.

2. The method according to claim 1, wherein the hollow fiber has an inner diameter of about 1 µm to about 250 µm.

3. The method according to claim 2, wherein the hollow fiber has an inner diameter of 25 µm to about 50 µm.

4. The method according to claim 1, wherein the hollow fiber is a hollow glass fiber.

5. The method according to claim 4, wherein the hollow fiber is a hollow fused silica fiber.

6. The method according to claim 1, wherein the fiber is cleaned and dried prior to insertion into the HSQ solution.

7. The method according to claim 1, wherein the solvent is methyl isobutyl ketone.

8. The method according to claim 1, wherein the reducing atmosphere comprises hydrogen gas.

9. The method according to claim 8, wherein the hydrogen gas is present at a concentration of about 1% to about 10% by weight.

10. The method according to claim 1, wherein the conditions in b) comprise heating to a suitable temperature of about 250° C. to about 350° C.

11. The method according to claim 10, wherein the temperature is increased to the suitable temperature at a rate of about 5° C./min.

12. The method according to claim 1, wherein the conditions in b) comprise heating at the suitable temperature for about 1 hour to about 3 hours.

13. The method according to claim 1, wherein the suitable temperature in c) is from about 900° C. to about 1300° C.

14. The method according to claim 13, wherein the suitable temperature in c) is about 1100° C.

15. The method according to claim 13, wherein the temperature is increased to the suitable temperature in c) at a rate of about 18° C./min.

16. The method according to claim 1, wherein the hollow fiber is heated at the suitable temperature in c) for about 0.5 hours to about 2 hours.

17. The method according to claim 1, wherein the hollow glass fiber is cooled in d) to room temperature.

18. The method according to claim 17, wherein the hollow glass fiber is cooled in d) at a rate of about 2° C./min.

19. The method of claim 1, wherein the whispering gallery mode resonator is a luminescent whispering gallery mode resonator.

* * * * *

UNITED STATES PATENT AND TRADEMARK OFFICE
CERTIFICATE OF CORRECTION

PATENT NO.          : 9,452,446 B2                             Page 1 of 1
APPLICATION NO.     : 12/934125
DATED               : June 7, 2016
INVENTOR(S)         : Jonathan Veinot et al.

It is certified that error appears in the above-identified patent and that said Letters Patent is hereby corrected as shown below:

In the Claims

Claim 1, Line 2, "whispering" should read -- a whispering --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*